United States Patent
Chen et al.

(10) Patent No.: US 12,406,731 B2
(45) Date of Patent: Sep. 2, 2025

(54) DYNAMIC LATCHES ABOVE A THREE-DIMENSIONAL NON-VOLATILE MEMORY ARRAY

(71) Applicant: Micron Technology, Inc., Boise, ID (US)

(72) Inventors: Jiewei Chen, Meridian, ID (US); Mithun Kumar Ramasahayam, Meridian, ID (US); Tomoko Ogura Iwasaki, San Jose, CA (US); June Lee, Sunnyvale, CA (US); Luyen Vu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 18/237,815

(22) Filed: Aug. 24, 2023

(65) Prior Publication Data

US 2024/0071505 A1 Feb. 29, 2024

Related U.S. Application Data

(60) Provisional application No. 63/401,052, filed on Aug. 25, 2022.

(51) Int. Cl.
*G11C 16/34* (2006.01)
*G11C 16/04* (2006.01)
*G11C 16/08* (2006.01)
*G11C 16/10* (2006.01)

(52) U.S. Cl.
CPC .......... *G11C 16/10* (2013.01); *G11C 16/0483* (2013.01); *G11C 16/08* (2013.01); *G11C 16/3459* (2013.01)

(58) Field of Classification Search
CPC ....................................................... G11C 16/34
See application file for complete search history.

(56) References Cited

U.S. PATENT DOCUMENTS

| | | |
|---|---|---|
| 2015/0078086 A1 | 3/2015 | Lee |
| 2018/0350823 A1 | 12/2018 | Or-Bach et al. |
| 2021/0174887 A1* | 6/2021 | Sanada ............ G11C 16/0483 |
| 2021/0358553 A1 | 11/2021 | Yang et al. |

OTHER PUBLICATIONS

International Search Report and Written Opinion for International Application No. PCT/US2023/031181, mailed Dec. 21, 2023, 12 Pages.

* cited by examiner

*Primary Examiner* — Jason Lappas
(74) *Attorney, Agent, or Firm* — LOWENSTEIN SANDLER LLP

(57) ABSTRACT

Control logic in a memory device causes a pass voltage to be applied to a plurality of wordlines of a block of a memory array of the memory device, the block comprising a plurality of sub-blocks, and the pass voltage to boost a channel potential of each of the plurality of sub-blocks to a boost voltage. The control logic further selectively discharges the boost voltage from one or more of the plurality of sub-blocks according to a data pattern representing a sequence of bits to be programmed to respective memory cells of the plurality of sub-blocks. In addition, the control logic causes a single programming pulse to be applied to a selected wordline of the plurality of wordlines of the block to program the respective memory cells of the plurality of sub-blocks according to the data pattern.

20 Claims, 11 Drawing Sheets

DYNAMIC LATCHES ABOVE A THREE-DIMENSIONAL NON-VOLATILE MEMORY ARRAY

RELATED APPLICATIONS

This application claims the benefit of U.S. Provisional Patent Application No. 63/401,052, filed Aug. 25, 2022, the entire contents of which are hereby incorporated by reference herein.

TECHNICAL FIELD

Embodiments of the disclosure relate generally to memory sub-systems, and more specifically, relate to dynamic latches above a three-dimensional non-volatile memory array in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
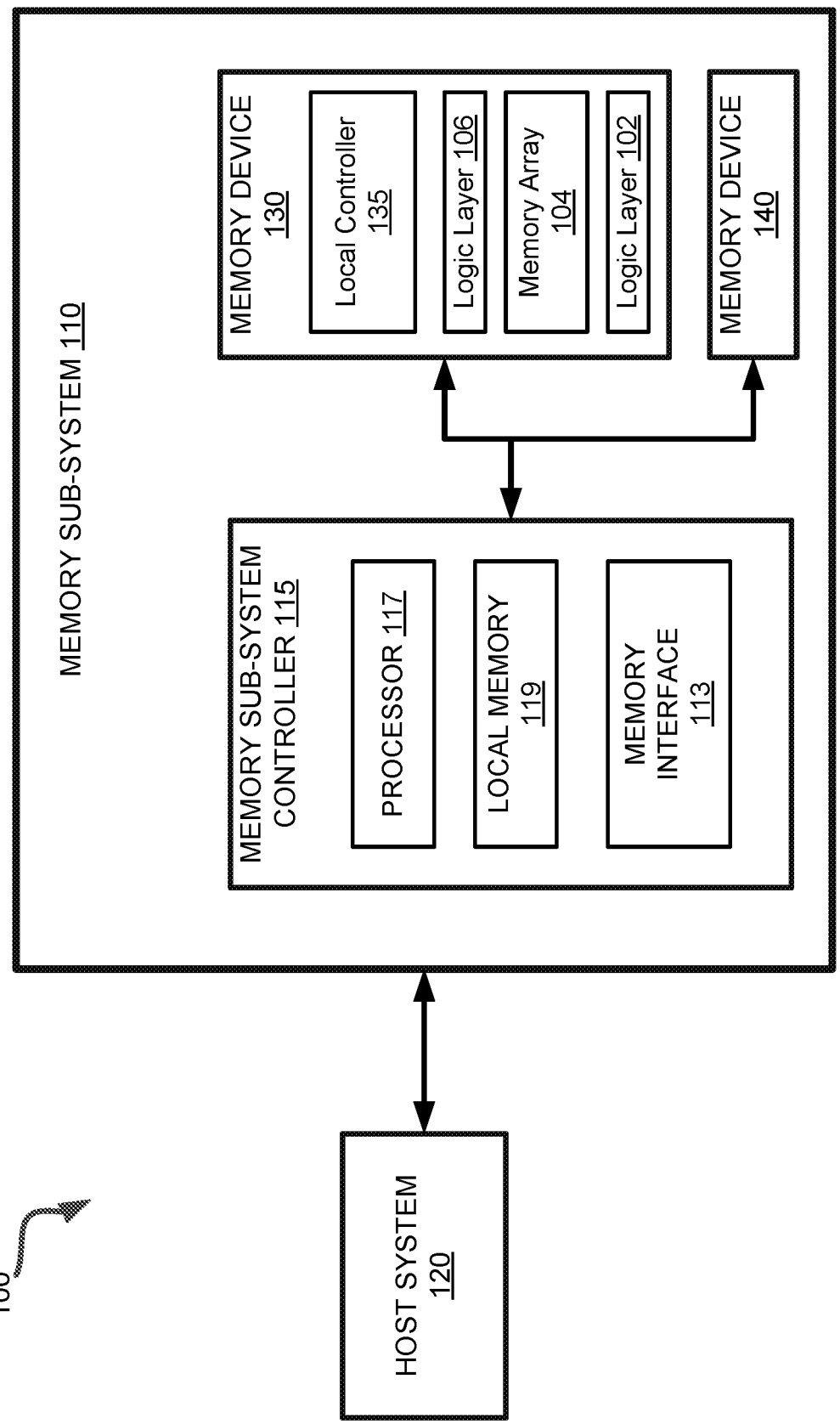
FIG. 1A illustrates an example computing system that includes a memory sub-system in accordance with some embodiments of the present disclosure.

Aspects of the present disclosure are directed to dynamic latches above a three-dimensional (3D) non-volatile memory array in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

During a program operation on a non-volatile memory device, certain phases can be encountered, including program and program verify. For example, a high program voltage can be applied to a selected wordline of a block of the memory device during a program phase, followed by a program verify phase where a verify voltage is applied to the selected wordline. Certain program operations can be single program operations, where one sub-block is programmed in each operation. In such a single program operation, a data pattern is read from a temporary storage location (e.g., a page buffer) to determine whether the memory cell associated with a selected wordline and located in the one sub-block is to be programmed or not, and a single programming pulse can be applied before the program verify phase occurs. This same process can then be repeated for each remaining sub-block to be programmed. Other program operations can be double program operations, for example, where two sub-blocks are programmed in one operation. In such a double program operation, the two sub-blocks can be programmed (i.e., two separate programming pulses can be applied) before the program verify phase occurs. Depending on the implementation, certain memory devices can utilize either a double verify operation or a seamless verify operation during the subsequent program verify phase. In either case, programming multiple sub-blocks involves causing multiple separate programming pulses to be applied to the selected wordline. There are latencies associated with each programming pulse including ramping up and down the program voltage multiple times. These latencies increase the temporal length of the program operation, which can be especially impactful in high-priority and time-sensitive operations.

Accordingly, certain memory devices implement double programming operations, such that the memory device can program memory cells in two or more separate sub-blocks using a single programming pulse applied to the selected wordline. For example, as part of a programming operation, control logic of the memory device causes a pass voltage to be applied to each wordline in a block of the memory device, including the selected wordline (i.e., the wordline associated with the memory cell(s) to be programmed) and unselected wordlines. The pass voltage boosts a memory pillar channel voltage in each sub-block of the memory device to a higher boost voltage during this phase of the program operation. Once each pillar channel voltage is boosted, the control logic can selectively discharge the pillars of one or more sub-blocks according to a data pattern of bits to be programmed to the block during the program operation. Such a process can be repeated for two or more sub-blocks. Once complete, the control logic can cause a single programming pulse to be applied to the selected wordlines. Those sub-blocks discharged to the ground voltage will be programmed, while those sub-blocks remaining at the boost voltage will be inhibited, thereby allowing multiple sub-blocks to be programmed concurrently via the single programming pulse. Either a double verify operation or a seamless verify operation can then be performed during the subsequent program verify phase.

As the number of bits to be programmed per memory cell increases, such as for triple-level cell (TLC) memory for example, where three bits are programmed in each memory cell, the number of latches used to store data associated with the program operation increases drastically. For example, to program memory device configured as TLC memory, at least five latches may be needed for each sub-block (e.g., three latches to hold the three bits of data, one program inhibit latch, and one slow program latch). If multiple sub-blocks are to be programmed using a single program pulse, the number of required latches is also increased by a corresponding multiple. Many memory devices include the programming latches in a logic layer disposed under the memory array. The amount of physical space in that logic layer under the array is limited, however, due to host system preferences for physically small memory devices (i.e., the size of the logic layer is limited to the same footprint as the associated memory array). Accordingly, there can be inadequate area under the memory array to place the larger number of latches used to program multiple sub-blocks with a single programming pulse.

Aspects of the present disclosure address the above and other deficiencies by providing dynamic latches above a 3D non-volatile memory array in a memory device of a memory sub-system. In one embodiment, a fixed number of latches can be implemented in the logic layer under the memory array of the memory device (e.g., within a page buffer circuit). For example, those latches might include a sense amplifier latch, as well as one set (e.g., a pair) of even cache register latches and one set (e.g., a pair) of odd cache register latches, which enable each page buffer circuit to be used with multiple sub-blocks of the array. The remaining latches used to program multiple sub-blocks with a single programming pulse (e.g., those latches used to store the data patterns to be programmed to the multiple sub-blocks) can instead be positioned in a separate logic layer above the memory array. The latches above the array can be coupled to the latches under the array such that data can be routed therebetween, as described herein. In general, the open area above the memory array is not space constrained and multiple layers (e.g., CMOS layers) can be formed to contain the associated latches. In one embodiment, each plane of the memory device can further include a hierarchical bitline structure with a main bitline and multiple local bitlines. The number of local bitlines relates directly to the number sub-blocks which can be programed with a single programming pulse.

Advantages of this approach include, but are not limited to, improved performance in the memory device. The arrangement of the latches above the array provides the number of latches used to program multiple sub-blocks in the memory device concurrently (e.g., simultaneously) using a single programming pulse, without increasing the footprint of the memory device. This results in the ability for fewer program operations to be performed (e.g., one half the number of program operations) for the same amount of data being programmed to the memory device, without materially increasing the size and/or area occupied by the memory device. Accordingly, the increased parallelism afforded by the latch structure described herein reduces the latency associated with the entire programming operation, which can improve programming performance.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Card (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages of the memory device used to store data. With some types of memory (e.g., NAND), pages can be grouped to form blocks.

Although non-volatile memory components such as a 3D cross-point array of non-volatile memory cells and NAND flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local controller 135) embodied thereon. In some embodiments, one or more components of memory sub-system 110 can be omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, memory device 130 includes local controller 135 and a memory array 104. As described herein, local controller 135 can perform a program operation on the memory cells of memory array 104. A program operation can include, for example, a program phase and a program verify phase. During the program phase, a program voltage is applied to a selected wordline(s) of the memory array 104, in order to program a certain level(s) of charge to selected memory cells on the wordline(s) representative of a desired value(s). In one embodiment, by conditioning the channel potential associated with multiple sub-blocks according to a data pattern to be programmed to the memory cells contained therein before the program voltage is applied to the selected wordline, multiple memory cells in separate sub-blocks can be accurately programmed using a single programming pulse. For example, at the start of the program operation, local controller 135 can cause a pass voltage to be applied to a plurality of wordlines of a block of memory array 104 in memory device 130. The block can include a plurality of sub-blocks, and the pass voltage can boost a channel potential of each of the plurality of sub-blocks to a boost voltage (Vboost). Local controller 135 can further selectively discharge the boost voltage from one or more of the plurality of sub-blocks according to a data pattern representing a sequence of bits to be programmed to respective memory cells of those sub-blocks. This can result in the channel potential of the sub-blocks containing memory cells to be programmed to discharge to a ground voltage. In addition, local controller 135 can cause a single programming pulse to be applied to a selected wordline of the plurality of wordlines of the block to program the respective memory cells of the plurality of sub-blocks according to the data pattern. In one embodiment, the memory cells in those sub-blocks for which the channel potential was discharged to ground will be programmed, while memory cells in those sub-blocks for which the channel potential was not discharged and remained at the boost voltage will be inhibited and not programmed. A program verify phase can then be initiated to verify that the memory cells were programmed correctly according to the data pattern.

In one embodiment, memory device 130 further includes a first logic layer 102 disposed under the memory array 104 (e.g., on a substrate and/or between the substrate and the memory array 104) and a second logic layer 106 disposed above the memory array 104 (e.g., on an opposite side of the memory array 104 from the substrate). In one embodiment, logic layer 102 (i.e., the logic layer under memory array 104) includes a page buffer circuit, for example, having a fixed number of latches or other data storage elements. In one embodiment, those latches in logic layer 102 include a sense amplifier latch, one set (e.g., a pair) of even cache register latches, and one set (e.g., a pair) of odd cache register latches. In other embodiments, rather than being disposed under the memory array 104, logic layer 102 can include a logic area on a separate CMOS chip that is bonded to memory array 104, for example. Logic layer 106 (i.e., the logic layer above memory array 104) can include the remaining latches used to program multiple sub-blocks with a single programming pulse, including those latches used to store the data patterns to be programmed to the multiple sub-blocks. In one embodiment, memory array 104 includes multiple planes, and each plane can further include a hierarchical bitline structure with a main bitline and multiple local bitlines, as described in more detail below.

Figure 1B:
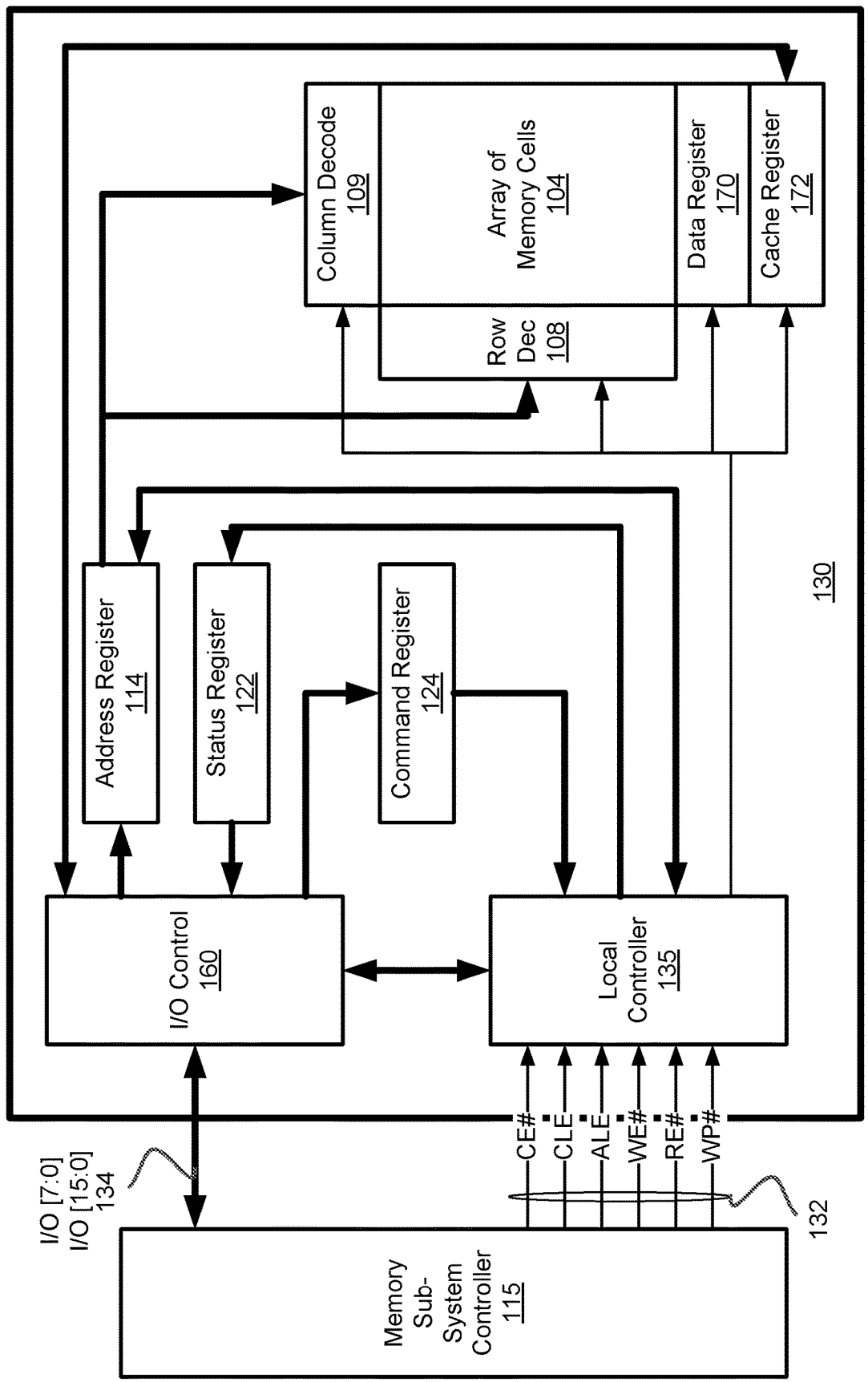
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are configured to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local controller 135 to latch incoming commands.

A controller (e.g., the local controller 135 internal to the memory device 130) controls access to the array of memory cells 104 in response to the commands and generates status information for the external memory sub-system controller 115, i.e., the local controller 135 is configured to perform access operations (e.g., read operations, programming operations and/or erase operations) on the array of memory cells 104. The local controller 135 is in communication with row decode circuitry 108 and column decode circuitry 109 to control the row decode circuitry 108 and column decode circuitry 109 in response to the addresses. In one embodiment, local controller 135 can perform a multi-cell program operation to concurrently (i.e., at least partially overlapping in time) program memory cells in two or more separate sub-blocks of a block of memory array 104 using a single programming pulse.

The local controller 135 is also in communication with a cache register 172. Cache register 172 latches data, either incoming or outgoing, as directed by the local controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
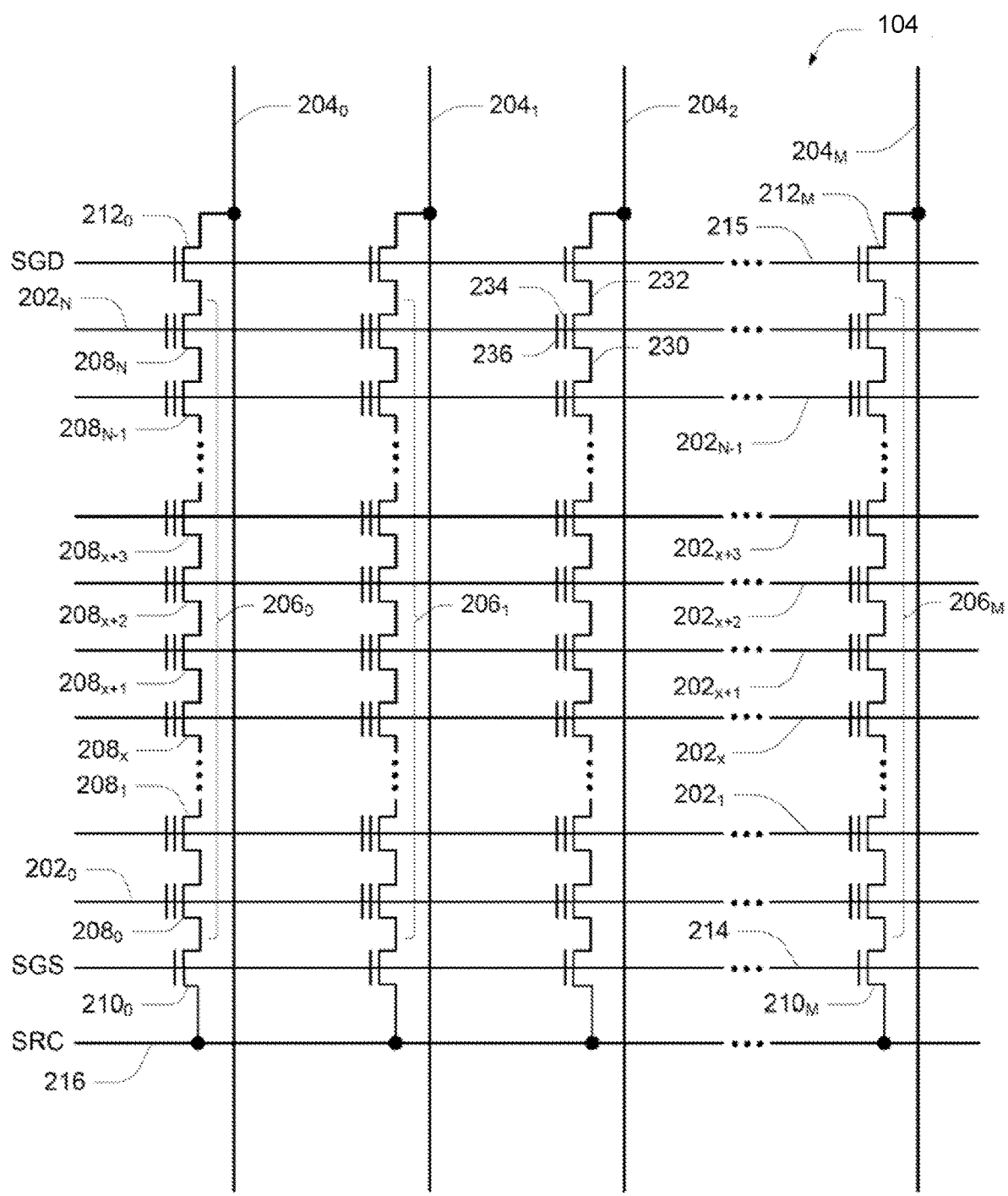
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
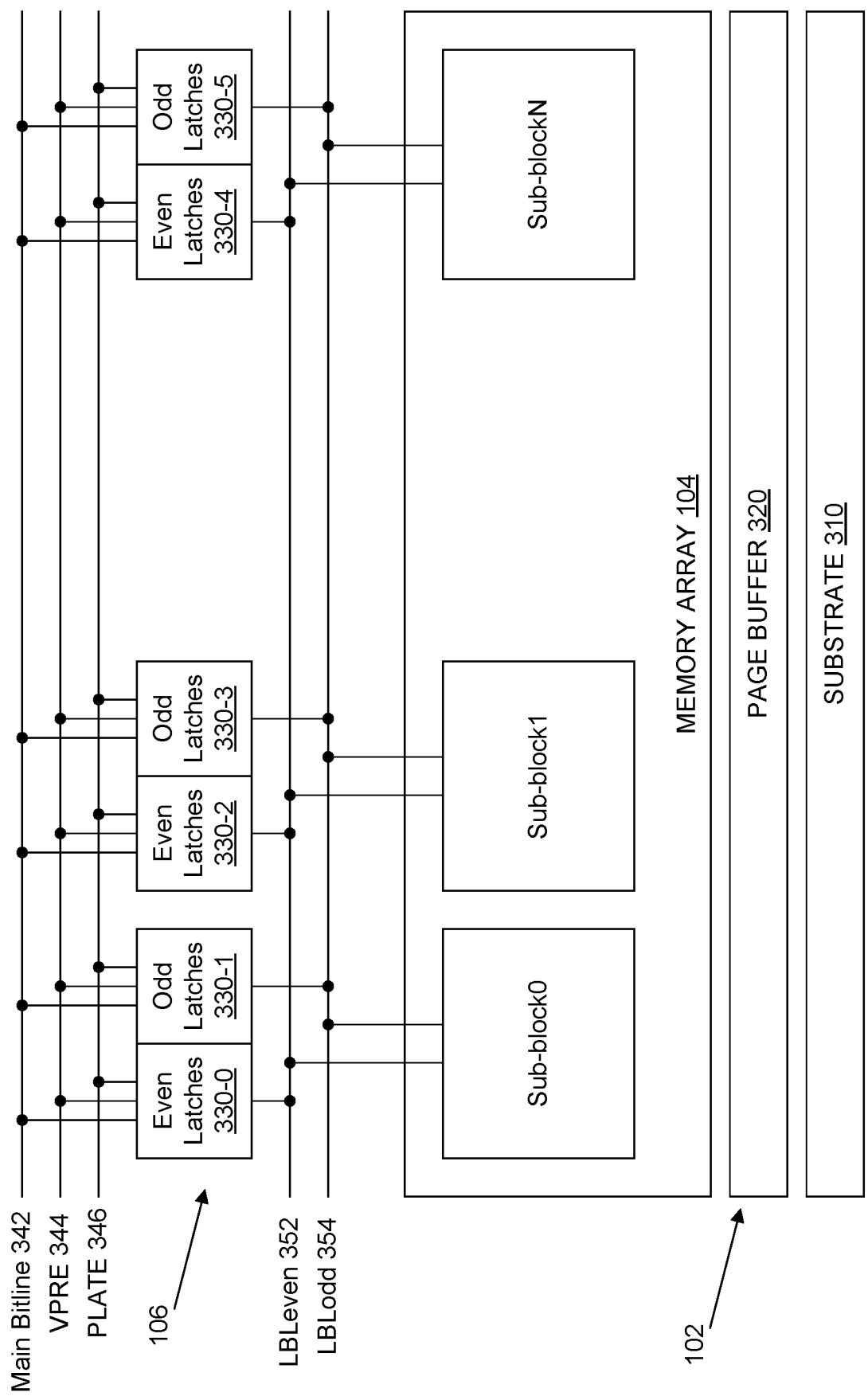
FIG. 3 is a block diagram illustrating portions of a memory device with dynamic latches above a three-dimensional non-volatile memory array in accordance with some embodiments of the present disclosure.

FIG. 3 is a block diagram illustrating portions of a memory device with dynamic latches above a three-dimensional non-volatile memory array in accordance with some embodiments of the present disclosure. As illustrated, the memory device includes a substrate 310 (e.g., a printed circuit board) on or above which a first logic layer 102, a memory array 104 and a second logic layer 106 can be formed. In one embodiment, the first logic layer 102 is disposed under the memory array 104 (e.g., on substrate 310 and/or between the substrate 310 and the memory array 104). In one embodiment, logic layer 102 includes a page buffer circuit 320, for example, having a fixed number of latches or other data storage elements, such as data register 170 and cache register 172, described above. In one embodiment, the second logic layer 106 is disposed above the memory array 104 (e.g., on an opposite side of the memory array 104 from substrate 310). Logic layer 106 can include the remaining latches used to program multiple sub-blocks (e.g., sub-block0-sub-blockN) of memory array 104 with a single programming pulse, including those latches used to store the data patterns to be programmed to the multiple sub-blocks. In one embodiment, logic layer 106 can include a set of even latches and a set of odd latches corresponding to each sub-block in memory array 104. For example, even latches 330-0 and odd latches 330-1 can be associated with sub-block0, even latches 330-2 and odd latches 330-3 can be associated with sub-block1, and even latches 330-4 and odd latches 330-5 can be associated with sub-blockN. As described in more detail below, each set of even and/or odd latches can include multiple latches, such as those latches used to store the data patterns to be programmed to the multiple sub-blocks of memory array 104 (e.g., one latch for each page of data), an inhibit latch, a sense latch, and one or more other latches. For example, there can be additional latches storing temporary information that can be used to accelerate the program operation and reduce the program time (e.g., the state information of a memory cell(s) on an adjacent wordline, SSPC (selective slow program convergence) data for a different sub-block(s)).

In one embodiment, the memory device includes a hierarchical bitline structure with a main bitline 342 and multiple local bitlines 352, 354. For example, the latches in logic layer 106 can be coupled between the main bitline 342 (or other voltage signal lines, such as VPRE 344 or PLATE 346) and a respective local bitline 352 or 354. In one embodiment, the even sets of latches, such as even latches 330-0, 330-2, and 330-4, are coupled to an even local bitline (i.e., LBLeven 352), and the odd sets of latches, such as odd latches 330-1, 330-3, and 330-5, are coupled to an odd local bitline (i.e., LBLodd 354). Depending on whether the latches in logic layer 106 are normal latches or special latches, the latches can be coupled to the main bitline 342 and VPLATE 346 or to VPRE 344 and VPLATE 346 (e.g., a ground voltage signal). For example, special latches can be coupled directly to the main bitline 342, while normal latches can be coupled to VPRE 344 (e.g., a voltage supply signal). In one embodiment, the majority of the latches in logic layer 106 are normal latches, while only a few special latches are used for transferring data between logic layer 106 and logic layer 102. The even and odd local bitline structure is motivated by process integration. Relaxation of the pitch, as well as locating all even latches on one side of the logic layer 106 and all odd latches on the other side, improves the ability to form a connection down to the local bitlines.

In one embodiment, the latches in logic layer 106 are organized to be associated with respective block groups in the memory array 104. A block group can span multiple blocks in the memory array 104, such as 96 blocks for example, with each block including a number of sub-blocks, such as sub-block0-sub-blockN. In one embodiment, logic layer 106 includes one set of even latches and one set of odd latches for each of sub-block0-sub-blockN. As described herein, these sets of latches can hold data to be programmed to multiple sub-blocks in parallel, such as by using a single programming pulse. In one embodiment, while the main bitline 342 may span the entire plane of the memory device, the local bitlines, such as LBLeven 352 and LBLodd 354, can be specific to the particular block group. As such, each block group can includes its own local bitlines, where the local bitlines are not shared across different block groups.

In one embodiment, the pitch between the local bitlines, such as LBLeven 352 and LBLodd 354, is so tight that it can be difficult, if not impossible to drop a connection onto just one of the bitlines (e.g., a connection to one of the latches in logic layer 106). Thus, in one embodiment, a local bitline plate (not shown in FIG. 3) can be included in logic layer 106. The local bitline plate can serve as a connection point for the latches in logic layer 106, and can be connected to the corresponding local bitline in a single location, for example, such as at a point between block groups, where the local bitline terminates.

Figure 4:
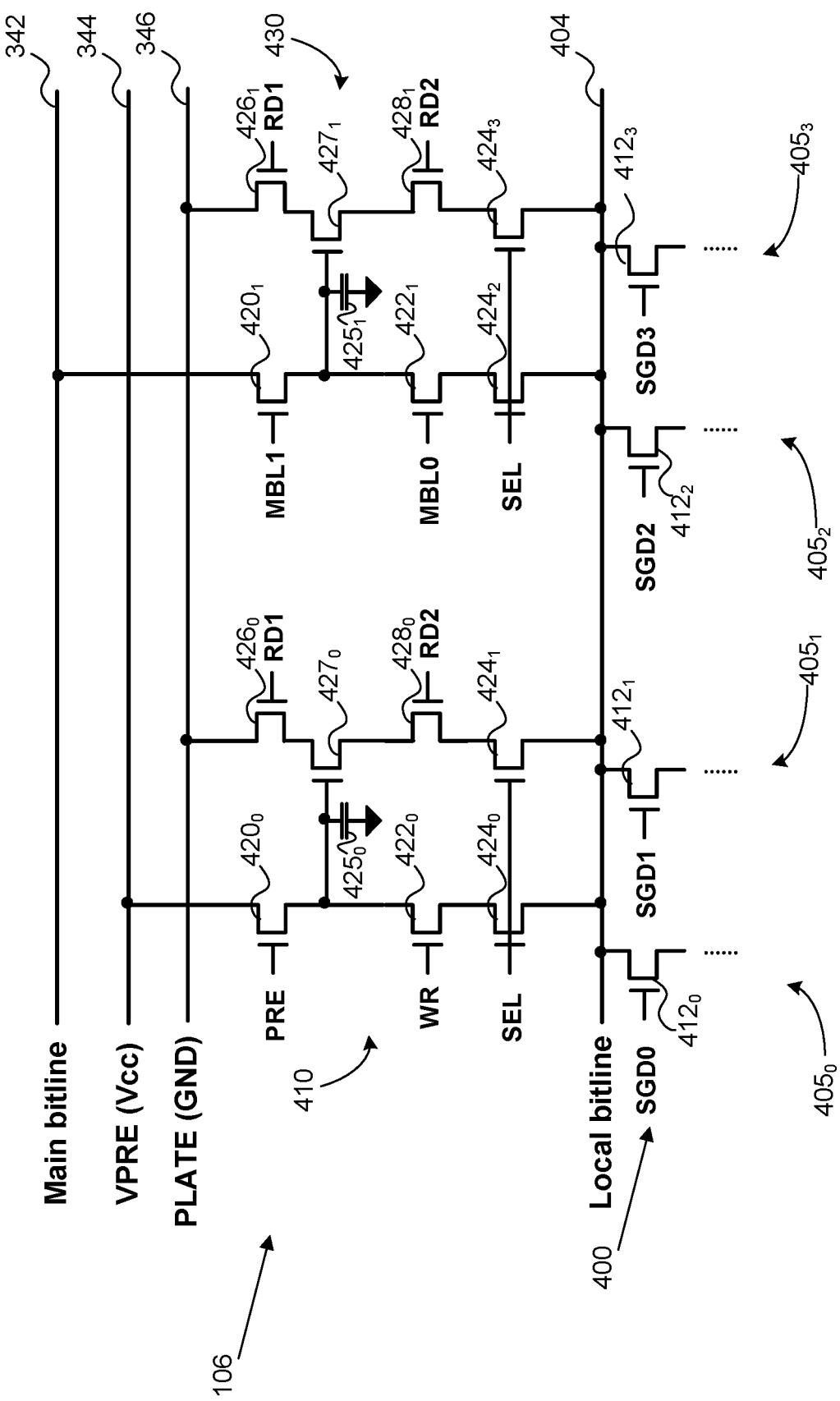
FIG. 4 is a schematic of portions of an array of memory cells with dynamic latches above the array in accordance with some embodiments of the present disclosure.

FIG. 4 is a schematic of portions of an array of memory cells with dynamic latches above the array in accordance with some embodiments of the present disclosure. The portion of the array of memory cells, such as memory array 104, can be a block 400, for example. In one embodiment, the block 400 includes strings of memory cells that can be grouped into sub-blocks, such as sub-blocks $405_0$-$405_3$. Other numbers of sub-blocks can be included in other embodiments.

Specifically, in at least some embodiments, the block 400 includes a local bitline 404 (e.g., one of local bitlines LBLeven 352 or LBLodd 354), where each sub-block is coupled to the local bitline 404. The first sub-block $405_0$ can include a first drain select (SGD) transistor $412_0$, a first source select (SGS) transistor, and a first string of memory cells coupled therebetween (not shown in FIG. 4). The second sub-block $405_1$ can include a second SGD transistor $412_1$, a second SGS transistor, and a second string of memory cells coupled therebetween (not shown in FIG. 4). The third sub-block $405_2$ can include a third SGD transistor $412_2$, a third SGS transistor, and a third string of memory cells coupled therebetween (not shown in FIG. 4). The fourth sub-block $405_3$ can include a fourth SGD transistor $412_3$, a fourth SGS transistor, and a fourth string of memory cells coupled therebetween (not shown in FIG. 4). Each SGS transistor can be connected to a common source (SRC), such as a source voltage line, to provide voltage to the sources of the multiple memory cells in each string. In some embodiments, the source voltage line includes a source plate that supplies the source voltage. In at least some embodiments, multiple wordlines (WLs) are coupled with gates of memory cells of each string of memory cells, such that one memory cell from the string in each sub-block is connected to each wordline and each memory cell in the string of any one sub-block is connected to a different wordline. In these embodiments, a first drain select gate line (SGD0) can be connected to the gate of the first SGD transistor $412_0$, a second drain select gate line (SGD1) can be connected to the gate of the second SGD transistor $412_1$, a third drain select gate line (SGD2) can be connected to the gate of the third SGD transistor $412_2$, and a fourth drain select gate line (SGD3) can be connected to the gate of the fourth SGD transistor $412_3$.

In one embodiment, logic layer 106 is disposed above memory array 104. Logic layer 106 can include one or more latches located above each block. For example, as illustrated in FIG. 4, latch 410 is disposed above block 400. For purposes of illustration, FIG. 4 also illustrates special latch 430 in logic layer 106 above block 400, however, in other embodiments, special latch 430 can be disposed above another block of the memory array 104. The latch 410 disposed above block 400 can be designated as either an even latch or an odd latch (i.e., depending on whether local bitline 404 is an even local bitline or an odd local bitline) corresponding to one of sub-blocks $405_0$-$405_3$ in block 400. It should be noted that there can be another latch (i.e., the opposite of either even or odd depending on what latch 410 is) associated with the one sub-block of block 400, which can be disposed above another block in the memory array 104. As illustrated, latch 410 includes a number of transistors coupled between precharge voltage (VPRE) line 344, ground voltage (VPLATE) line 346, and the local bitline 404. Latch 410 can further include a storage element to store a level of charge representative of a bit of data to be programmed into the memory cells of one of sub-blocks $405_0$-$405_3$ in block 400. Special latch 430, however, includes a number of transistors coupled between the main bitline 342, ground voltage (VPLATE) line 346, and the local bitline 404. Special latch 430 can further include a storage element to store a level of charge representative of a bit of data to be copied into latch 410 or another latch in logic layer 106. In one embodiment, there is only a fixed number of special latches, such as special latch 430, in each block group. Since only special latch 430 is connected to the main bitline 342, while all of the normal latches, such as latch 410, are isolated from the main bitline 342, the main bitline 342 can remain free to be used for data transfers between logic layer 106 (i.e., the logic layer above the memory array 104) and logic layer 102 (i.e., the logic layer below the memory array 104.) All data moved from the special latch 430 to latch 410, or from latch 410 to block 400, can be moved via local bitline 404, for example.

In one embodiment, latch 410 includes block select transistors $424_0$ and $424_1$, which can be controlled by a select signal SEL (e.g., received from local controller 135 or other control logic). Block select transistors $424_0$ and $424_1$ can be activated when latch 410 is either being written to or read from during a program operation of a block, such as block 400, to which latch 410 corresponds. Latch 410 further includes precharge transistor $420_0$ controlled by precharge signal PRE and write transistor $422_0$ controlled by write signal WR. Local controller 135, or other control logic, can activate precharge transistor $420_0$ in order to store a value in latch 410 corresponding to the precharge signal 344 (e.g., a power supply signal) and/or activate write transistor $422_0$ in order to store a value in latch 410 from local bitline 404 (e.g., a value received from special latch 430). In one embodiment, latch 410 includes a capacitor $425_0$, or other storage element, to store a level of charge representative of a bit of data to be programmed into the memory cells of one of sub-blocks $405_0$-$405_3$ in block 400. If the level of charge on capacitor $425_0$ is high enough, transistor $427_0$ is activated, allowing signal flow between read transistors $426_0$ and $428_0$. Read transistor $426_0$ is controlled by read signal RD1 and read transistor $428_0$ is controlled by read signal RD2. Local controller 135, or other control logic, can activate read transistor $426_0$ to discharge the stored charge to ground (i.e., PLATE signal 346) or activate read transistor $428_0$ to move the level of charge onto local bitline 404 to program the memory cells of one of sub-blocks $405_0$-$405_3$ in block 400.

In one embodiment, special latch 430 includes select transistors $424_2$ and $424_3$, which can be controlled by a select signal SEL (e.g., received from local controller 135 or other control logic). Select transistors $424_2$ and $424_3$ can be activated when special latch 430 is either being written to or read from during a program operation. Special latch 430 further includes transistor $420_1$ controlled by signal MBL1 and transistor $422_1$ controlled by signal MBL0. Local controller 135, or other control logic, can activate transistor $420_1$ in order to store a value in special latch 430 from the main bitline 342 (e.g., received from logic layer 102) and/or activate transistor $422_1$ in order to store a value in special latch 430 from local bitline 404. In one embodiment, special latch 430 includes a capacitor $425_1$, or other storage element, to store a level of charge representative of a bit of data to be copied into latch 410 or another latch in logic layer 106. If the level of charge on capacitor $425_1$ is high enough, transistor $427_1$ is activated, allowing signal flow between read transistors $426_1$ and $428_1$. Read transistor $426_1$ is controlled by read signal RD1 and read transistor $428_1$ is controlled by read signal RD2. Local controller 135, or other control logic, can activate read transistor $426_1$ to discharge the stored charge to ground (i.e., PLATE signal 346) or activate read transistor $428_1$ to move the level of charge onto local bitline 404 to be copied into latch 410 or another latch in logic layer 106.

In on embodiment, local controller 135 can perform a multi-cell program operation to concurrently program memory cells in two or more separate sub-blocks of block 400 using a single programming pulse applied to a selected wordline (e.g., $WL_N$). In one embodiment, as part of a programming operation, the control logic causes a pass voltage (Vpass) to be applied to each wordline of the block 400 concurrently. The pass voltage boosts a memory pillar channel voltage (e.g., due to gate-to-channel capacitive coupling) in each of sub-blocks $405_0$-$405_3$ to a higher boost voltage (Vboost) during this phase of the programming operation.

Once each pillar channel voltage is boosted, local controller 135 can selectively discharge the pillars of one or more sub-blocks according to a data pattern of bits to be programmed to block 400 during the program operation. In one embodiment, the data pattern is read from the latches in logic layer 106 disposed above the memory array, and represented by a voltage on the local bitline 404. For example, if a memory cell associated with the selected wordline $WL_N$ and located in sub-block $405_1$ is to be programmed, local controller can activate the second SGD transistor $412_1$ by asserting a signal on the second drain select gate line (SGD1) to allow the boost voltage to be discharged onto the local bitline 404, thereby bringing the channel voltage in sub-block $405_1$ back to a ground voltage (e.g., 0V). Conversely, if a memory cell associated with the selected wordline $WL_N$ and located in sub-block $405_0$ is not to be programmed, local memory controller 135 will not activate the first SGD transistor $412_0$, thereby causing the pillar channel voltage in sub-block $405_0$ to remain at the boost voltage. This sequence can be repeated for two or more sub-blocks, including for example sub-blocks $405_2$-$405_3$ in addition. Once complete, local controller 135 can cause a single programming pulse (Vpgm) to be applied to the selected wordline $WL_N$. Since the channel voltage in sub-block $405_1$ is at the ground voltage, the gate to channel voltage differential (e.g., Vpgm–GND) is large enough that selected memory cell in sub-block $405_1$ will be programmed. Since the channel voltage in sub-block $405_0$ is at the boost voltage, the gate to channel voltage differential (e.g., Vpgm–Vboost) is too small, such that selected memory cell in sub-block $405_0$ will not be programmed. Local controller 135 can then perform either a double verify operation or a seamless verify operation during the subsequent program verify phase to confirm that memory cells were properly programmed.

In general, the latches in logic layer 106 can be characterized as gain cells having two parallel strings of transistors, each being formed around a separate pillar. In one embodiment, each string includes three or more devices connected in series. These devices can be formed in a number of horizontal layers extending above the memory array 104. In one embodiment, there is a capacitive gate layer that connects between one pillar channel and the gate terminal of a device in the other pillar. This capacitive gate layer can include the charge storage device for the latch, such as capacitors $425_0$ or $425_1$. Although one example implementation of the latches in logic layer 106 is illustrated in FIG. 4, in other embodiments, other implementations are possible.

Figure 5:
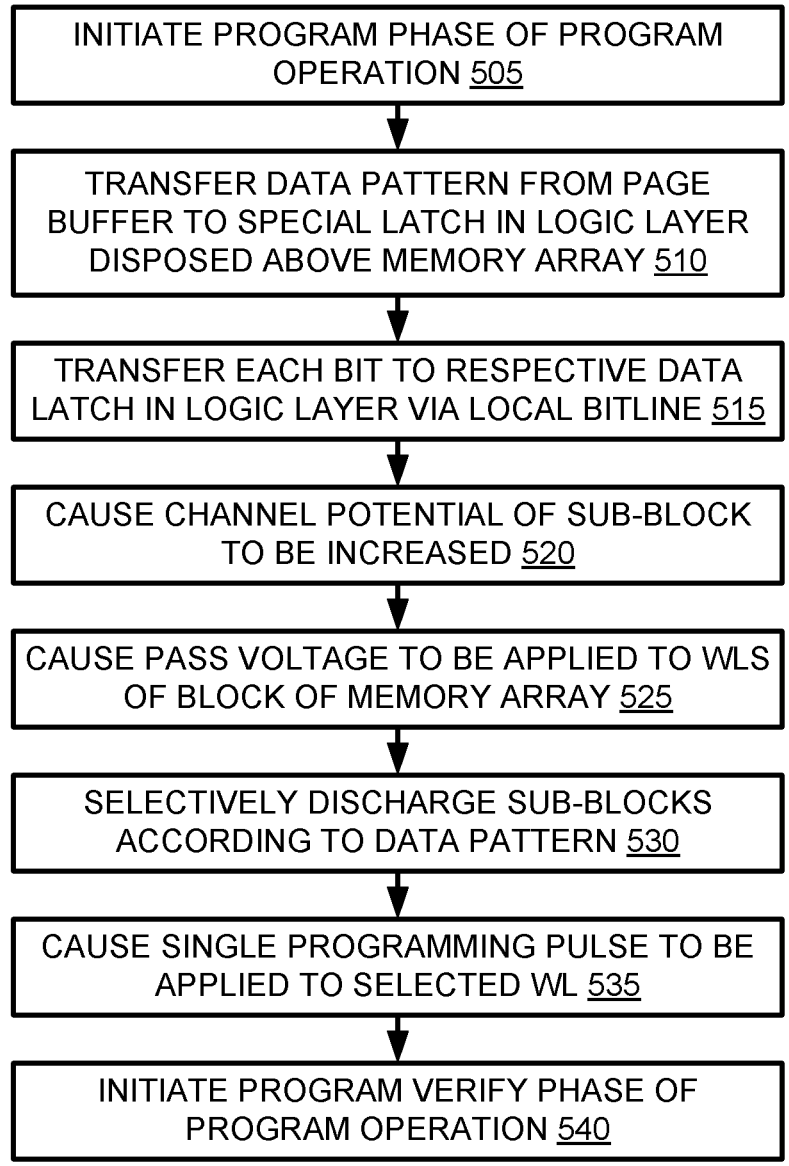
FIG. 5 is a flow diagram of an example method of multi-cell programming in a memory device of a memory sub-system in accordance with some embodiments of the present disclosure.

FIG. 5 is a flow diagram of an example method of multi-cell programming in a memory device of a memory sub-system in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by local controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a program operation is initiated. In one embodiment, the program operation includes a program phase and a program verify phase. In certain embodiments, each of these phases can be repeated numerous times in a cycle during a single program operation. During the program phase, a program voltage is applied to selected wordlines of the memory device 130, in order to program a certain level of charge to the selected memory cells on the wordlines representative of a desired value. The desired value can be represented by a multi-bit data pattern (e.g., stored in a page buffer of the memory device 130), where each bit is to be stored in a separate memory cell associated with the selected wordline.

At operation 510, the data pattern is transferred to a logic layer above the memory array. For example, control logic (e.g., local controller 135) can store a multi-bit data pattern in a plurality of latches in a logic layer disposed above the memory array 104, such as logic layer 106. In one embodiment, the multi-bit data pattern represents a sequence of bits to be programmed to respective memory cells of a plurality of sub-blocks $405_0$-$405_3$ of a block 400 of the memory array 104. In one embodiment, the memory device includes a substrate 310 and the memory array 104 is disposed between the substrate 310 and the logic layer 106 disposed above the memory array. In one embodiment, storing the multi-bit data pattern in the latches in logic layer 106 includes transferring the data pattern from a page buffer 320 in a logic layer 102 disposed below the memory array 104 to the logic layer 106 disposed above the memory array via a main bitline of the memory device, such as main bitline 342. In one embodiment, the data pattern is received at the logic layer 106 by a special latch, such as latch 430, coupled between the main bitline 342 and a local bitline 404 associated with a block group comprising the block to which the data pattern is to be programmed. In one embodiment, the logic layer 102 disposed below the memory array 104 is disposed between the memory array 104 and the substrate 310.

At operation 515, the data pattern is transferred to data latches within the logic layer above the memory array. In one embodiment, the control logic transfers each bit in the sequence of bits to a respective one of a plurality of data latches, such as latch 410, in the logic layer 106 disposed above the memory array via the local bitline 404, where the plurality of data latches are isolated from the main bitline 342.

At operation 520, the channel potential of a sub-block of a block of memory array 104 of memory device 130 is optionally increased. For example, the control logic can cause the channel potential of at least one of sub-blocks $405_0$-$405_3$ to be increased to a boost voltage (Vboost) according to the data pattern stored in the latches of logic layer 106 prior to causing a pass voltage to be applied to the wordlines of the block. In one embodiment, the signal on one drain select gate line, such as the first drain select gate line SGD0, is driven high to activate a corresponding SGD transistor, such as SGD transistor $412_0$, allowing the voltage representing the data pattern on the bitline (BL) to charge the corresponding pillar channel for sub-block $410_0$.

At operation 525, a pass voltage is applied to the wordlines of a block of memory array 104 of memory device 130. For example, the control logic can cause the pass voltage (Vpass) to be applied to a plurality of wordlines of the block concurrently. In one embodiment, the block, such as block 400, includes sub-blocks $405_0$-$405_3$, each including a string of memory cells surrounding a pillar of channel material. The pass voltage boosts a memory pillar channel voltage (e.g., due to gate to channel capacitive coupling) in each of sub-blocks $405_0$-$405_3$ to a higher boost voltage (Vboost) during this phase of the program operation.

At operation 530, one or more sub-blocks are selectively discharged. For example, the control logic can selectively discharge the boost voltage from one or more of the sub-blocks $405_0$-$405_3$ according to the data pattern representing the sequence of bits to be programmed to respective memory cells of the plurality of sub-blocks. For example, if a memory cell associated with the selected wordline $WL_N$ and located in sub-block $405_1$ is to be programmed, local controller 135 can activate the second SGD transistor $412_1$ by asserting a signal on the second drain select gate line (SGD1) to allow the boost voltage to be discharged onto the local bitline 404, thereby bringing the channel voltage in sub-block $405_1$ back to a ground voltage (e.g., 0V). Conversely, if a memory cell associated with the selected wordline $WL_N$ and located in sub-block $405_0$ is not to be programmed, local memory controller 135 will not activate the first SGD transistor $412_0$, thereby causing the pillar channel voltage in sub-block $405_0$ to remain at the boost voltage. This sequence can be repeated for two or more sub-blocks, including for example sub-blocks $405_2$-$405_3$ in addition. In one embodiment, the memory device structure described herein allows for parallel operations to take place on different blocks and/or different block groups. For example, the programming operations 520, 525, and 530 could be performed on the sub-blocks of one block in memory array 114 while the data transfer operations 510 and 515 are concurrently performed (i.e., at least partially overlapping in time) for another block in the same or a different block group.

At operation 535, a programming pulse is applied to the selected wordline. For example, the control logic can cause a single programming pulse to be applied to the selected wordline $WL_N$ of the plurality of wordlines of the block 400 to program the respective memory cells of the plurality of sub-blocks according to the data pattern. Since the channel voltage in sub-block $405_1$ is at the ground voltage, the gate to channel voltage differential (e.g., Vpgm−GND) is large enough that the selected memory cell will be programmed. Since the channel voltage in sub-block $405_0$ is at the boost voltage, the gate to channel voltage differential (e.g., Vpgm−Vboost) is too small, such that the selected memory cell will not be programmed.

At operation 540, a program verify phase is initiated. During the program verify phase, a read voltage is applied to the selected word lines to read the level of charge stored at the selected memory cells to confirm that the desired value was properly programmed. Depending on the implementation, certain memory devices can utilize either a double verify operation or a seamless verify operation during the program verify phase.

Figure 6:
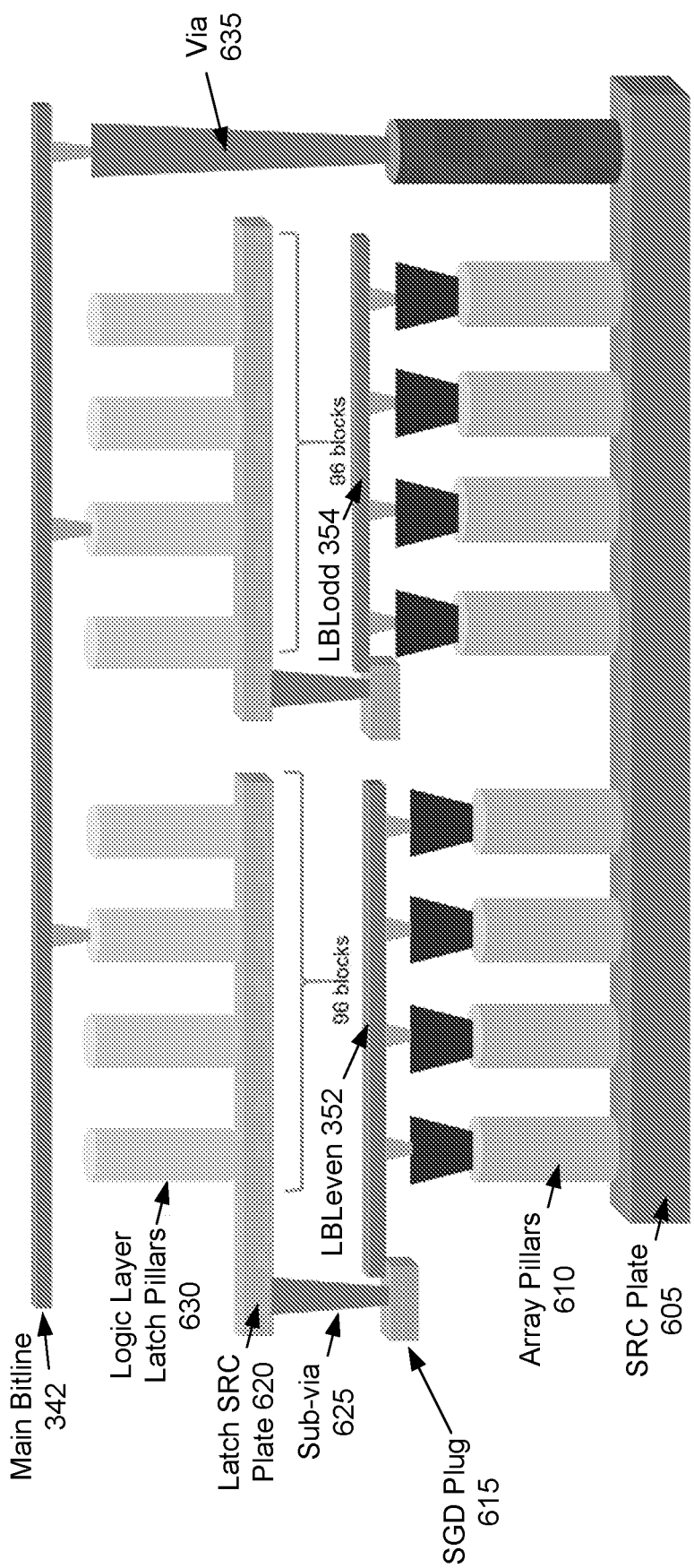
FIG. 6 is a diagram illustrating portions of the structure formation of dynamic latches above a three-dimensional non-volatile memory array in accordance with some embodiments of the present disclosure.

FIG. 6 is a diagram illustrating portions of the structure formation of dynamic latches above a three-dimensional non-volatile memory array in accordance with some embodiments of the present disclosure. In one embodiment, the memory array, such as memory array 104, is formed on source (SRC) plate 605. For example, a number of array pillars 610 can be formed on source plate 605, with each pillar used to form a string of memory cells, where each string forms a sub-block in the memory array. As described herein, each array pillar can be coupled to a corresponding local bitline, such as LBLeven 352 or LBLodd 354. Due to space constraints and the associated pitch of the local bitlines, each local bitline can have a respective select gate plug coupled at one end, such as SGD plug 615. Above local bitlines, a number of additional source plates can be formed, such as latch source (SRC) plate 620. The SGD plug 615 can have a relaxed pitch with adequate space to connect to latch SRC plate 620 using sub-via 625.

In one embodiment, a number of logic layer latch pillars 640 can be formed on each respective latch SRC plate 620. Each logic layer latch pillar can be used to form a string of latches that make up a portion of logic layer 106 above the memory array. A number of horizontal layers can be formed across the logic layer latch pillars 630 with a separate latch formed at the intersection of each horizontal layer and each vertical logic layer latch pillar. As described herein, certain ones of the logic layer latch pillars 630 are coupled directly to main bitline 342. Other ones of the logic layer latch pillars 630 are coupled to other signal lines, such as VPRE or PLATE (not shown in FIG. 6). In addition, in one embodiment, via 635 can be formed to couple main bitline 342 directly to source plate 605. Via 635 can bypass the logic layer 106 and memory array 104.

Figure 7:
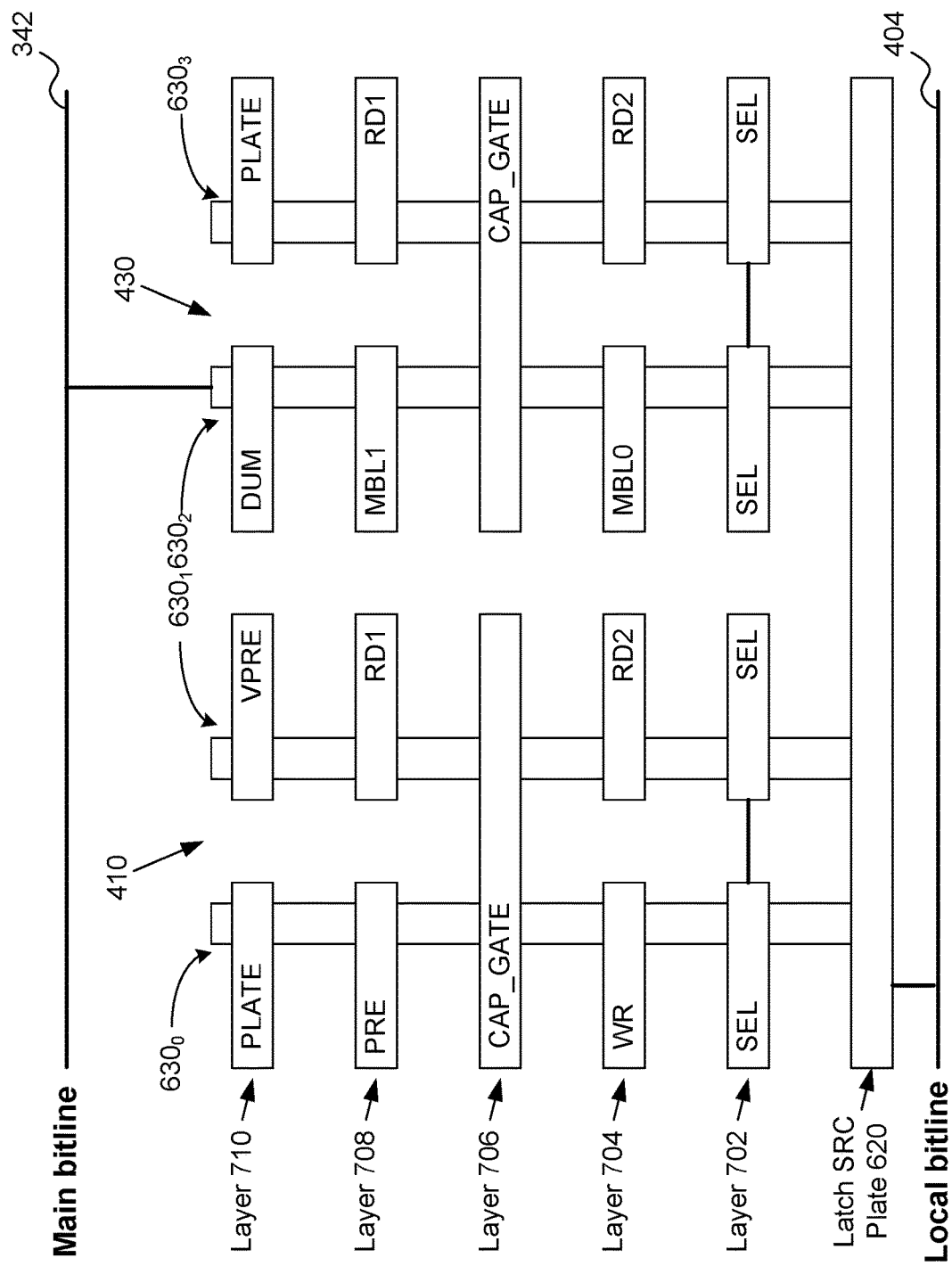
FIG. 7 is a block diagram illustrating portions of the structure formation of dynamic latches above a three-dimensional non-volatile memory array in accordance with some embodiments of the present disclosure.

FIG. 7 is a block diagram illustrating portions of the structure formation of dynamic latches above a three-dimensional non-volatile memory array in accordance with some embodiments of the present disclosure. Specifically, in at least some embodiments, the portion includes a local bitline 404 (e.g., one of local bitlines LBLeven 352 or LBLodd 354), a common latch source (SRC) plate 620, and a number of logic layer latch pillars $630_0$-$630_3$ formed on latch source plate 620 and extending vertically above. A number of devices can be formed where horizontal layers 702, 704, 706, 708, and 710 intersect logic layer latch pillars $630_0$-$630_3$. These devices can together form latches that make up at least a portion of logic layer 106 disposed above memory array 104. The illustrated portion of FIG. 7 includes latch 410 and special latch 430, as described above with respect to FIG. 4. For example, latch 410 can be formed from devices in pillars $630_0$ and $630_1$, while special latch 430 can be formed from devices in pillars $630_2$ and $630_3$.

In one embodiment, the portion of logic layer 106 includes latch SRC plate 620 formed above local bitline 404. Local bitline 404 can be representative of either LBLeven 352 or LBLodd 354, for example. In one embodiment, latch SRC plate 620 is coupled to local bitline 404, such as by SGD plug 615 and sub-via 625, as shown in FIG. 6. In one embodiment, the horizontal layers 702, 704, 706, 708, and 710 can be formed above, and substantially parallel to, latch SRC plate 620. The horizontal layers 702, 704, 706, 708, and 710 can be formed across (e.g., substantially perpendicular to) logic layer latch pillars $630_0$-$630_3$. As described in more detail below with respect to FIGS. 8A-8F, the horizontal layers 702, 704, 706, 708, and 710 can be formed from a conducting material, such as poly-silicon, separated by layers of oxide. Main bitline 342 can be formed above the horizontal layers.

In one embodiment, horizontal layer 702 includes selection devices (SEL), such as select transistors $424_0$ and $424_1$ in latch 410, and select transistors $424_2$ and $424_3$ in special latch 430. Each of the selection devices in horizontal layer 702 can be controlled by a select signal SEL (e.g., received from local controller 135 or other control logic). The selection devices can be activated when latch 410 or special latch 430 is either being written to or read from during a program operation.

In one embodiment, horizontal layer 704 includes a write transistor (WR) and a read transistor (RD2) in latch 410 and a transistor (MBL0) and a read transistor (RD2) in special latch 430. Local controller 135, or other control logic, can activate the write transistor in order to store a value in latch 410 from local bitline 404 or the read transistor to move the value from latch 410 to local bitline 404 to program the memory cells in a corresponding sub-block. Local controller 135, or other control logic, can activate the transistor in order to store a value in special latch 430 from main bitline 342 or the read transistor to move the value from special latch 430 to local bitline 404.

In one embodiment, horizontal layer 706 includes the gate terminals for respective capacitive storage devices in latch 410 and special latch 430. The capacitive storage devices, such as capacitor $425_0$ and capacitor $425_1$, stores respective levels of charge representing bits of data to be programmed into the memory cells.

In one embodiment, horizontal layer 708 includes a precharge transistor (PRE) and a read transistor (RD1) in latch 410 and a transistor (MBL1) and a read transistor (RD1) in special latch 430. Local controller 135, or other control logic, can activate the precharge transistor in order to store a value in latch 410 corresponding to a precharge signal (e.g., a power supply signal) and can activate the read transistor to discharge the stored charge from latch 410 to ground. Local controller 135, or other control logic, can activate the transistor in order to store a value in special latch 430 from the main bitline 342 (e.g., received from logic layer 102) and can activate the read transistor to move the value from special latch 430 onto local bitline 404 to be copied into latch 410 or another latch in logic layer 106.

In one embodiment, horizontal layer 710 includes a connection to ground (PLATE) and a precharge voltage (VPRE) in latch 410 and a connection (DUM) to the main bitline 342 and a connection to ground (PLATE) in special latch 430.

FIGS. 8A-8L are diagrams illustrating a process flow for formation of dynamic latches above a three-dimensional non-volatile memory array in accordance with some embodiments of the present disclosure. FIGS. 8A-8L represent a series of processing operations to be performed in the formation of the structure of latch 410 and special latch 430, as illustrated in FIG. 4 and in FIG. 7. Both latch 410 and special latch 430 can be part of logic layer 106 above the memory array 104, as shown in FIG. 3 and in FIG. 6. The processing operations illustrated in FIGS. 8A-8L can be part of a manufacturing process performed using semiconductor fabrication equipment.

Figure 8A:
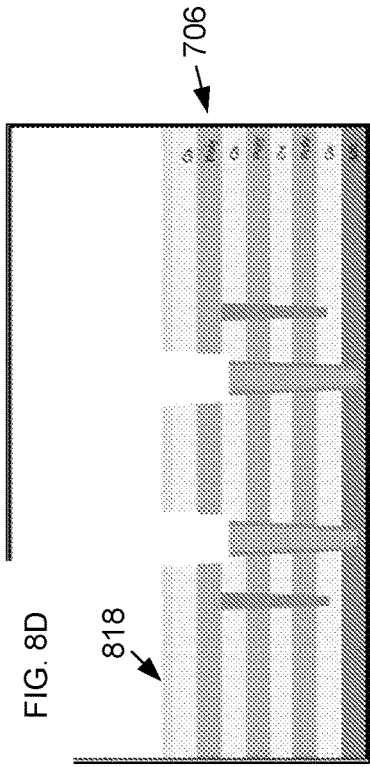
FIGS. 8A-8L are diagrams illustrating a process flow for formation of dynamic latches above a three-dimensional non-volatile memory array in accordance with some embodiments of the present disclosure.

In FIG. 8A, horizontal layers 702 and 704 are formed above latch SRC plate 620 in a vertical stack. The horizontal layers 702 and 704 can be formed from poly-silicon or other conducting material. In one embodiment, intervening layers of oxide or other non-conducting material are formed in the vertical stack to separate the horizontal layers 702 and 704 from latch SRC plate 620 and from each other. In one embodiment, cuts 802 and 804 are formed in the vertical stack through the horizontal layers 702 and 704 and the intervening oxide layers down to the latch SRC plate 620. In addition, cuts 806 and 808 are formed in the vertical stack through the horizontal layers 702 and 704 and the intervening oxide layers but stop short of the latch SRC plate 620. In one embodiment, the cuts 802 and 804 have a first size (e.g., width) and the cuts 806 and 808 have a second size, where the first size is larger than the second size. Cuts 802 and 804 will form two latch pillars, such as two of logic layer latch pillars 630, while cuts 806 and 808 will provide isolation between the latch pillars.

Figure 8B:
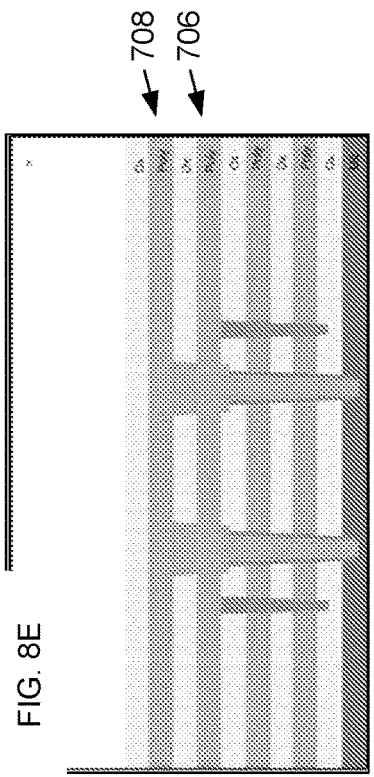

In FIG. 8B, a sidewall fill operation is performed on cuts 802 and 804. In the sidewall fill operation, a non-conducting material (e.g., nitride-converted oxide) 810 is applied to the sidewalls of cuts 802 and 804. In one embodiment, cuts 806 and 808 are filled entirely with the non-conducting material. In addition, a photoresist layer 812 is applied to the top of the vertical stack except for above cuts 802 and 804. Furthermore, a punch operation is performed in the bottom of cuts 802 and 804 to form a connection with latch SRC plate 620.

Figure 8C:
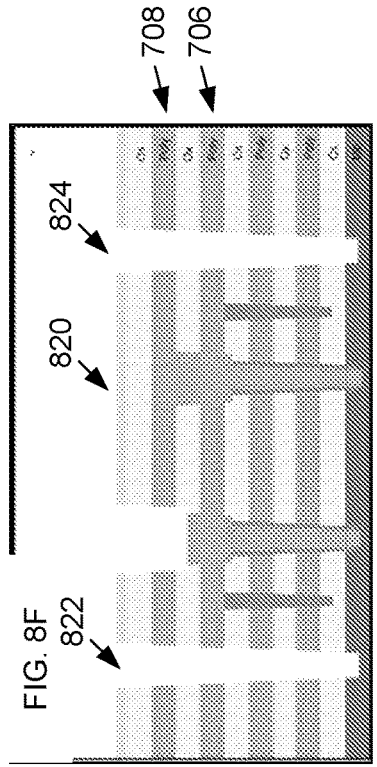

In FIG. 8C, another sidewall fill operation is performed on cuts 802 and 804. In this sidewall fill operation, a conducting material (e.g., poly-silicon) 814 is applied to the sidewalls of cuts 802 and 804 on top of the previously applied non-conducting material 810. In addition, a remaining portion of cuts 802 and 804 is entirely filled with a non-conducting material (e.g., oxide) and the photoresist layer 812 is removed.

Figure 8D:
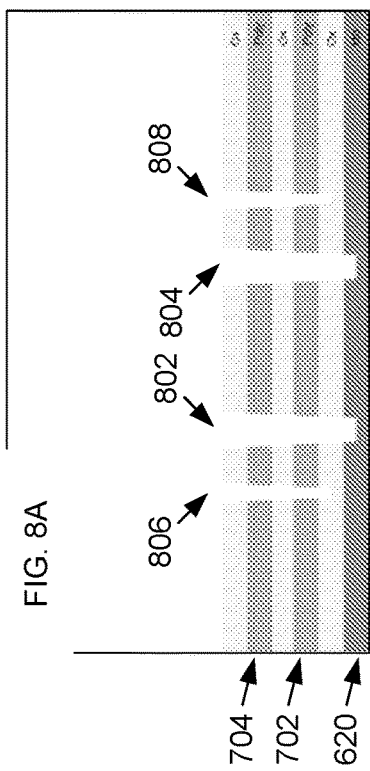

In FIG. 8D, horizontal layer 706 is formed on top of the vertical stack. The horizontal layer 706 can be formed from poly-silicon or other conducting material. In one embodiment, intervening layers of oxide or other non-conducting material are formed in the vertical stack to separate the horizontal layer 706 from the other conducting layers. In one embodiment, cuts 802 and 804 are expanded to the top of the vertical stack (i.e., up through an oxide layer above horizontal layer 706. In one embodiment, the cuts 802 and 804 are expanded using patterning in a photoresist layer 818 on top of the vertical stack.

Figure 8E:
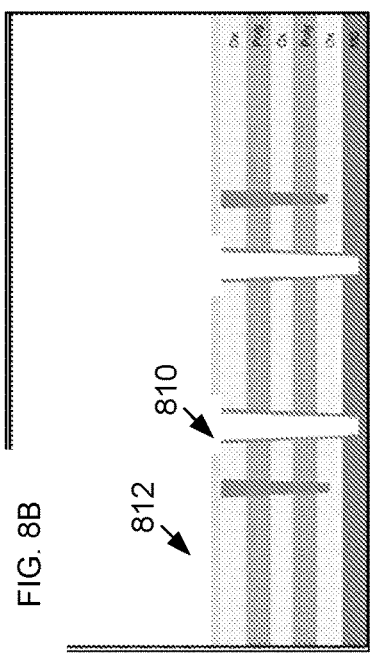
Figure 8F:
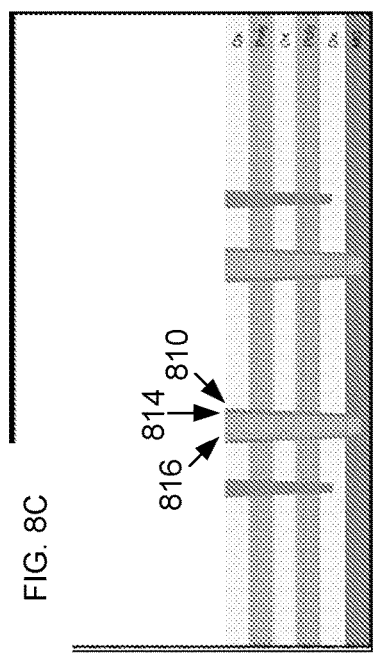

In FIG. 8E, horizontal layer 708 is formed on top of the vertical stack. The horizontal layer 708 can be formed from poly-silicon or other conducting material. In one embodiment, intervening layers of oxide or other non-conducting material are formed in the vertical stack to separate the horizontal layer 708 from the other conducting layers. In one embodiment, cuts 802 and 804 are also entirely filled with the poly-silicon to create electrical shorts between horizontal layers 706 and 708.

In FIG. 8F, cut 802 is again expanded to the top of the vertical stack (i.e., up through on oxide layer above horizontal layer 708). In one embodiment, the cut 802 is expanded using patterning in a photoresist layer 820 on top of the vertical stack. In one embodiment, cut 802 extends from the top of the vertical stack down through horizontal layer 708 into the oxide layer between horizontal layers 708 and 706. In addition, cuts 822 and 824 are formed in the vertical stack through the horizontal layers 702-708 and the intervening oxide layers down to the latch SRC plate 620. Cuts 822 and 824 will form two additional latch pillars.

Figure 8G:
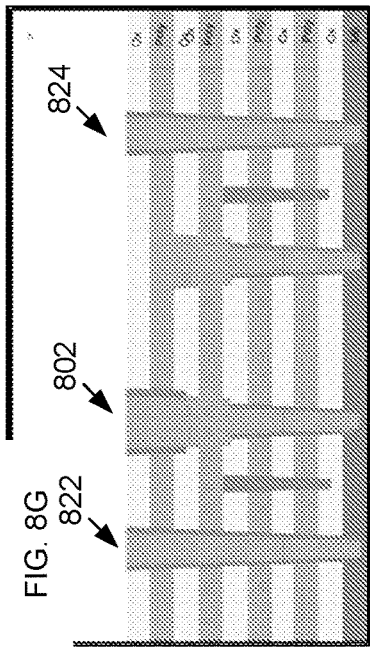

In FIG. 8G, a sidewall fill operation is performed on cuts 802, 822, and 824. In this sidewall fill operation, a non-conducting material (e.g., nitride-converted oxide) is applied to the sidewalls of cuts 802, 822, and 824. In addition, a punch operation is performed in the bottom of cuts 822 and 824 to form a connection with latch SRC plate 620. Subsequently, another sidewall fill operation is performed where a conducting material (e.g., poly-silicon) is applied to the sidewalls of cuts 802, 822, and 824 on top of the previously applied non-conducting material. In addition, a remaining portion of cuts 802, 822, and 824 is entirely filled with a non-conducting material (e.g., oxide).

Figure 8H:
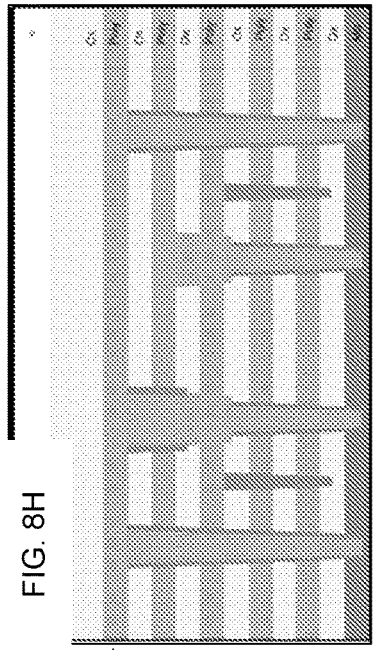
Figure 8I:
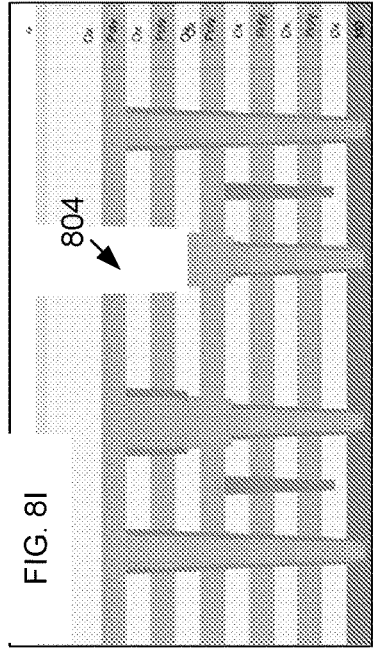

In FIG. 8H, horizontal layer 710 is formed on top of the vertical stack. The horizontal layer 710 can be formed from poly-silicon or other conducting material. In one embodiment, intervening layers of oxide or other non-conducting material are formed in the vertical stack to separate the horizontal layer 710 from the other conducting layers. In one embodiment, an additional oxide layer is formed above horizontal layer 710 that is thicker (e.g., taller) than the horizontal layers or other oxide layers in the vertical stack.

In FIG. 8I, cut 804 is again expanded to the top of the vertical stack (i.e., up through the oxide layer above horizontal layer 710). In one embodiment, the cut 804 is expanded using patterning in a photoresist layer on top of the vertical stack. In one embodiment, cut 804 extends from the top of the vertical stack down through horizontal layers 710 and 708 into the oxide layer between horizontal layers 708 and 706.

Figure 8J:
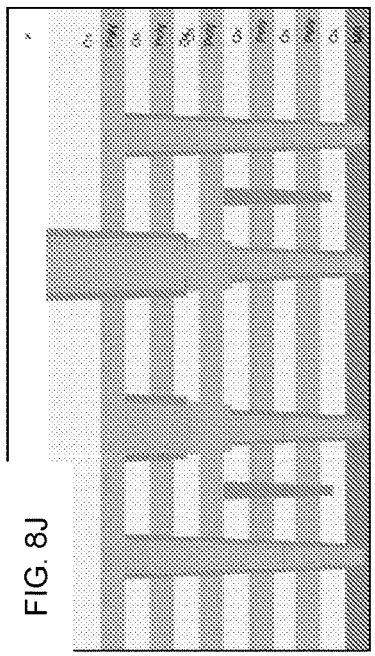

In FIG. 8J, a sidewall fill operation is performed on cut 804. In this sidewall fill operation, a non-conducting material (e.g., nitride-converted oxide) is applied to the sidewalls of cut 804. Subsequently, another sidewall fill operation is performed where a conducting material (e.g., poly-silicon) is applied to the sidewalls of cut 804 on top of the previously applied non-conducting material. In addition, a remaining portion of cut 804 is entirely filled with a non-conducting material (e.g., oxide).

Figure 8K:
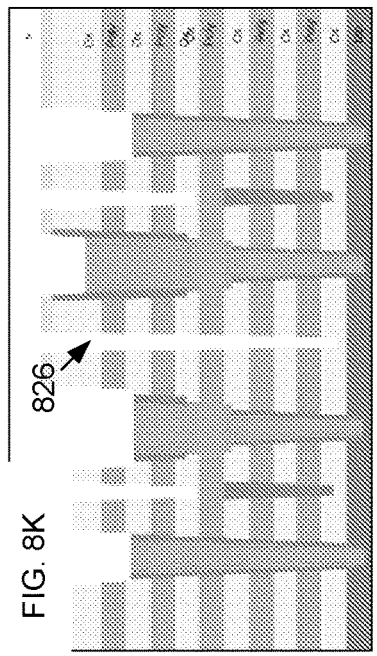

In FIG. 8K, cuts 802, 804, 806, 808, 822, and 824 are expanded to the top of the vertical stack (i.e., up through the oxide layer above horizontal layer 710). In one embodiment, the cuts are expanded using patterning in a photoresist layer on top of the vertical stack. In addition, a new cut 826 is formed in the vertical stack through the horizontal layers 702-710 and the intervening oxide layers but stops short of SRC plate 620. In one embodiment, the cut 826 has the second size (i.e., the same as cuts 806 and 808). Cut 826 will provide isolation between the latch pillars formed within cuts 802 and 804.

Figure 8L:
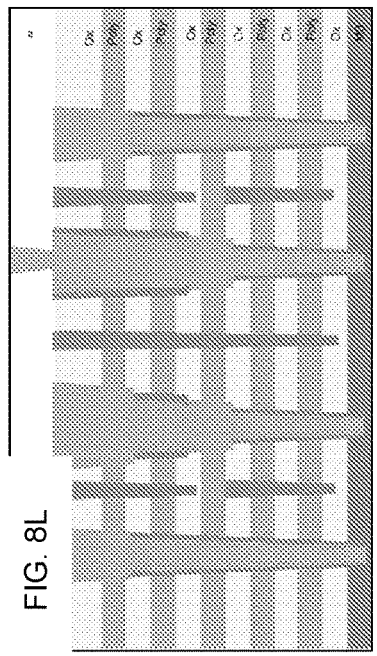

In FIG. 8L, the remaining portions of cuts 802, 804, 822, and 824 are filled with a conducting material (e.g., poly-silicon) to form connections from the top of the vertical stack to the horizontal layer 710. In addition, the remaining portions of cuts 806, 808, and 826 are filled with a non-conducting material (e.g., oxide) to provide isolation between the latch pillars.

With the vertical stack fully formed, the intersections between horizontal layers 702-710 and the vertical latch pillars can form devices that make up latch 410 or special latch 430. For example, the latch pillars in cuts 802 and 822 can be used to form latch 410 and the latch pillars in cuts 804 and 824 can be used to form special latch 430. The arrangement of the devices in horizontal layers 702-710 can be the same as shown with respect to FIG. 7 and FIG. 4. In other embodiments, the process illustrated in FIGS. 8A-8L can be repeated as many times as necessary to form the entirety of logic layer latch pillars 630 that make up logic layer 106 above the memory array 104. In addition, although the formation of only four latch pillars used to form two latches is illustrated, it should be understood that any number of latch pillars and latches can be formed using the same processing techniques.

Figure 9:
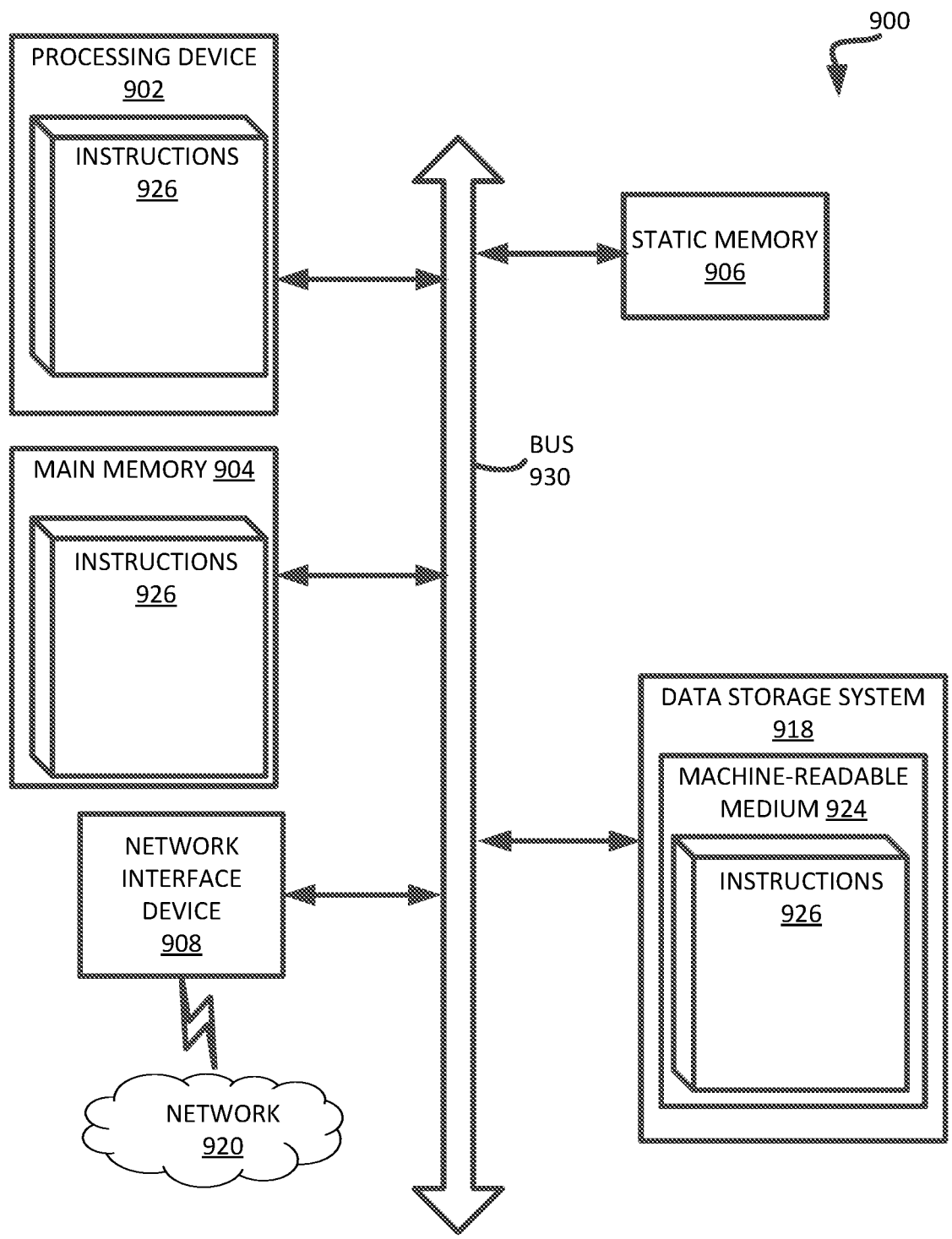
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the local controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), etc.), a static memory 906 (e.g., static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to the local controller 135 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array; and
    control logic, operatively coupled with the memory array, to perform operations comprising:
        storing a multi-bit data pattern in a plurality of latches in a logic layer disposed above the memory array, the multi-bit data pattern representing a sequence of bits to be programmed to respective memory cells of a plurality of sub-blocks of a block of the memory array;
        pre-charging the plurality of sub-blocks according to the multi-bit data pattern; and
        causing a single programming pulse to be applied to a selected wordline of a plurality of wordlines of the block to program the respective memory cells of the plurality of sub-blocks according to the data pattern.

2. The memory device of claim 1, further comprising:
    a substrate, wherein the memory array is disposed between the substrate and the logic layer disposed above the memory array.

3. The memory device of claim 2, wherein storing the multi-bit data pattern in the plurality of latches in the logic layer disposed above the memory array comprises:
    transferring the data pattern from a page buffer in a logic layer disposed below the memory array to the logic layer disposed above the memory array via a main bitline of the memory device, wherein the data pattern is received at the logic layer disposed above the memory array by a special latch coupled between the main bitline and a local bitline associated with a block group comprising the block to which the data pattern is to be programmed, and wherein the logic layer disposed below the memory array is disposed between the memory array and the substrate.

4. The memory device of claim 3, wherein storing the multi-bit data pattern in the plurality of latches in the logic layer disposed above the memory array further comprises:
    transferring each bit in the sequence of bits to a respective one of a plurality of data latches in the logic layer disposed above the memory array via the local bitline, wherein the plurality of data latches are isolated from the main bitline.

5. The memory device of claim 1, wherein pre-charging the plurality of sub-blocks according to the multi-bit data pattern comprises:
    causing a pass voltage to be applied to the plurality of wordlines of the block of the memory array, the pass voltage to boost a channel potential of each of the plurality of sub-blocks to a boost voltage; and
    selectively discharging the boost voltage from one or more of the plurality of sub-blocks according to the data pattern stored in the plurality of latches in the logic layer disposed above the memory array.

6. The memory device of claim 5, wherein each wordline of the plurality of wordlines is coupled to a respective set of memory cells in the block, and wherein one memory cell from each respective set of memory cells is associated with one of the plurality of sub-blocks of the block, wherein each of the plurality of sub-bocks comprises a string of memory cells sharing a pillar of channel material, and wherein each memory cell in the string of memory cells is associated with a respective wordline of the plurality of wordlines, and wherein the plurality of sub-blocks comprises respective select gate devices to couple the strings of memory cells to a bit line.

7. The memory device of claim 6, wherein selectively discharging the boost voltage from one or more of the plurality of sub-blocks according to the data pattern comprises:
    activating one or more of the respective select gate devices corresponding to one or more first sub-blocks for which the respective memory cells are to be programmed to cause the channel potential of the one or more first sub-blocks to decrease to a ground potential; and
    not activating one or more of the respective select gate devices corresponding to one or more second sub-blocks for which the respective memory cells are not to be programmed to cause the channel potential of the one or more second sub-blocks to remain at the boost voltage.

8. The memory device of claim 7, wherein the single programming pulse applied to the selected wordline of the plurality of wordlines of the block is to program the respective memory cells of the one or more first sub-blocks and not program the respective memory cells of the one or more second sub-blocks.

9. A method comprising:
    storing a multi-bit data pattern in a plurality of latches in a logic layer disposed above a memory array, the multi-bit data pattern representing a sequence of bits to be programmed to respective memory cells of a plurality of sub-blocks of a block of the memory array;
    pre-charging the plurality of sub-blocks according to the multi-bit data pattern; and
    causing a single programming pulse to be applied to a selected wordline of a plurality of wordlines of the block to program the respective memory cells of the plurality of sub-blocks according to the data pattern.

10. The memory device of claim 9, further comprising:
    a substrate, wherein the memory array is disposed between the substrate and the logic layer disposed above the memory array.

11. The method of claim 10, wherein storing the multi-bit data pattern in the plurality of latches in the logic layer disposed above the memory array comprises:
    transferring the data pattern from a page buffer in a logic layer disposed below the memory array to the logic layer disposed above the memory array via a main bitline of the memory device, wherein the data pattern is received at the logic layer disposed above the memory array by a special latch coupled between the main bitline and a local bitline associated with a block group comprising the block to which the data pattern is to be programmed, and wherein the logic layer disposed below the memory array is disposed between the memory array and the substrate.

12. The method of claim 11, wherein storing the multi-bit data pattern in the plurality of latches in the logic layer disposed above the memory array further comprises:
transferring each bit in the sequence of bits to a respective one of a plurality of data latches in the logic layer disposed above the memory array via the local bitline, wherein the plurality of data latches are isolated from the main bitline.

13. The method of claim 9, wherein pre-charging the plurality of sub-blocks according to the multi-bit data pattern comprises:
causing a pass voltage to be applied to the plurality of wordlines of the block of the memory array, the pass voltage to boost a channel potential of each of the plurality of sub-blocks to a boost voltage; and
selectively discharging the boost voltage from one or more of the plurality of sub-blocks according to the data pattern stored in the plurality of latches in the logic layer disposed above the memory array.

14. The method of claim 13, wherein each wordline of the plurality of wordlines is coupled to a respective set of memory cells in the block, and wherein one memory cell from each respective set of memory cells is associated with one of the plurality of sub-blocks of the block, wherein each of the plurality of sub-bocks comprises a string of memory cells sharing a pillar of channel material, and wherein each memory cell in the string of memory cells is associated with a respective wordline of the plurality of wordlines, and wherein the plurality of sub-blocks comprises respective select gate devices to couple the strings of memory cells to a bit line.

15. The method of claim 14, wherein selectively discharging the boost voltage from one or more of the plurality of sub-blocks according to the data pattern comprises:
activating one or more of the respective select gate devices corresponding to one or more first sub-blocks for which the respective memory cells are to be programmed to cause the channel potential of the one or more first sub-blocks to decrease to a ground potential; and
not activating one or more of the respective select gate devices corresponding to one or more second sub-blocks for which the respective memory cells are not to be programmed to cause the channel potential of the one or more second sub-blocks to remain at the boost voltage.

16. The method of claim 15, wherein the single programming pulse applied to the selected wordline of the plurality of wordlines of the block is to program the respective memory cells of the one or more first sub-blocks and not program the respective memory cells of the one or more second sub-blocks.

17. A memory device comprising:
a memory array comprising a plurality of block groups, each block group comprising a plurality of blocks, and each block comprising a plurality of sub-blocks;
a logic layer disposed above the memory array, the logic layer disposed above the memory array comprising a plurality of latches to store a multi-bit data pattern representing a sequence of bits to be programmed to respective memory cells of the plurality of sub-blocks of one of the plurality of blocks of the memory array; and
control logic coupled to the memory array and to the logic layer disposed above the memory array, wherein the control logic is to program the respective memory cells of the plurality of sub-blocks according to the multi-bit data pattern using a single programming pulse.

18. The memory device of claim 17, further comprising:
a substrate, wherein the memory array is disposed between the substrate and the logic layer disposed above the memory array;
a main bitline associated with the plurality of block groups; and
a plurality of local bitlines, wherein each local bitline is associated with a respective one of the plurality of block groups,
wherein the control logic is further to store the multi-bit data pattern in the plurality of latches in the logic layer disposed above the memory array by transferring the data pattern from a page buffer in a logic layer disposed below the memory array to the logic layer disposed above the memory array via the main bitline of the memory device, wherein the data pattern is received at the logic layer disposed above the memory array by a special latch coupled between the main bitline and a local bitline associated with a block group comprising the block to which the data pattern is to be programmed, and wherein the logic layer disposed below the memory array is disposed between the memory array and the substrate.

19. The memory device of claim 18, wherein storing the multi-bit data pattern in the plurality of latches in the logic layer disposed above the memory array further comprises:
transferring each bit in the sequence of bits to a respective one of a plurality of data latches in the logic layer disposed above the memory array via the local bitline, wherein the plurality of data latches are isolated from the main bitline.

20. The memory device of claim 17, wherein to program the respective memory cells of the plurality of sub-blocks according to the multi-bit data pattern using the single programming pulse, the control logic is to:
pre-charge the plurality of sub-blocks according to the multi-bit data pattern, wherein the pre-charging comprises:
causing a pass voltage to be applied to the plurality of wordlines of the block of the memory array, the pass voltage to boost a channel potential of each of the plurality of sub-blocks to a boost voltage; and
selectively discharging the boost voltage from one or more of the plurality of sub-blocks according to the data pattern stored in the plurality of latches in the logic layer disposed above the memory array.

* * * * *